(12) United States Patent
Iorga et al.

(10) Patent No.: US 7,595,746 B2
(45) Date of Patent: Sep. 29, 2009

(54) INTERPOLATION DIGITAL-TO-ANALOG CONVERTER

(75) Inventors: Cosmin Iorga, Newbury Park, CA (US); Alan Hussey, Oak Park, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/964,254

(22) Filed: Dec. 26, 2007

(65) Prior Publication Data

US 2009/0167583 A1    Jul. 2, 2009

(51) Int. Cl.
*H03M 1/66* (2006.01)
(52) U.S. Cl. .................. 341/145; 341/144
(58) Field of Classification Search .......... 341/144, 341/145, 136
See application file for complete search history.

(56) References Cited

U.S. PATENT DOCUMENTS

| | | | | |
|---|---|---|---|---|
| 5,493,519 A | * | 2/1996 | Allen, III ............... | 702/120 |
| 5,990,815 A | * | 11/1999 | Linder et al. ............ | 341/131 |
| 6,232,904 B1 | * | 5/2001 | Hartmann et al. ........ | 341/145 |
| 6,549,155 B1 | * | 4/2003 | Heminger et al. ........ | 341/144 |

* cited by examiner

*Primary Examiner*—Brian Young
(74) *Attorney, Agent, or Firm*—Fish & Richardson P.C.

(57) ABSTRACT

A digital-to-analog converter (DAC) includes coarse interpolation DACs configured to produce a current range based on an input digital signal, and fine interpolation DACs configured to produce an output current that is based on an input digital signal and that is within the current range produced by the coarse interpolation DACs.

27 Claims, 5 Drawing Sheets

INTERPOLATION DIGITAL-TO-ANALOG CONVERTER

TECHNICAL FIELD

This patent application relates generally to an interpolation-type digital-to-analog converter (DAC).

BACKGROUND

A DAC is used to convert a digital signal into an analog signal. An interpolation DAC steers current through differently-sized transistors in order to generate an output analog signal that corresponds to the input digital signal.

ATE refers to an automated, usually computer-driven, systems for testing devices, such as semiconductors, electronic circuits, and printed circuit board assemblies. A device tested by ATE is referred to as a device under test (DUT). ATEs use DACs in a variety of ways. For example, a DAC may convert a digital test signal to analog form for transmission to the DUT.

SUMMARY

This patent application describes methods and apparatus, including circuitry, for implementing an interpolation DAC.

Described herein is a digital-to-analog converter (DAC) that includes coarse interpolation DACs configured to produce a current range based on an input digital signal, and fine interpolation DACs configured to produce an output current that is based on an input digital signal and that is within the current range produced by the coarse interpolation DACs. The foregoing DAC may include one or more of the following features, either alone or in combination.

The coarse interpolation DACs may comprise two DACs that are controlled based on a first subset of bits from the digital signal. The fine interpolation DACs may comprise two DACs that are controlled based on a second subset of bits from the digital signal. The first subset of bits may comprise more significant bits in the digital signal than the second subset of bits.

The coarse interpolation DACs may comprise a first coarse interpolation DAC that is controlled directly by the first subset of bits, and a second coarse interpolation DAC that is controlled by sums or differences that are formed from the first subset of bits. The fine interpolation DACs may comprise a first fine interpolation DC that is controlled directly by the second subset of bits, and a second fine interpolation DAC that is controlled by a complement of the second subset of bits.

The output current produced by the fine interpolation DACs may correspond to an analog current for the input digital signal. The DAC may comprise a current source to supply current to the fine interpolation DACs, where the current source is capable of outputting a maximum current, and circuitry to subtract the analog current from the maximum current to produce a DAC output.

The coarse interpolation DACs each may comprise parallel-connected transistors for passing current from the fine interpolation DACs. The fine interpolation DACs each may comprise parallel-connected transistors for passing current from a current source to a corresponding coarse interpolation DAC.

The DAC may comprise an N-bit DAC, where $N \geq 2$. Each of the coarse interpolation DACs and the fine interpolation DACs may comprise N transistors. The DAC may further comprise circuitry to generate a complement of the output current, where the complement of the output current comprises an output of the DAC.

This patent application also describes an N-bit ($N \geq 2$) DAC comprising first transistors that are controllable to pass current from a current source, second transistors that are controllable to pass current from the first transistors, third transistors that are controllable to pass current from the current source, and fourth transistors that are controllable to pass current from the third transistors. The first transistors comprise N/2 pairs of transistors that are controlled based on a first set of N/2 bits of an input digital signal or a complement of the first set of N/2 bits; the second transistors comprise N/2 pairs of transistors that are controlled based on a second set of N/2 bits of the input digital signal; the third transistors comprise N/2 pairs of transistors that are controlled based on the complement of the first set of N/2 bits or by the first set of N/2 bits, and the fourth transistors comprise N/2 pairs of transistors that are controlled based on the second set of N/2 bits with a value added or subtracted thereto. The foregoing DAC may include one or more of the following features, either alone or in combination.

At least one of the second transistors may be configured to pass a first current. At least one of the fourth transistors may be configured to pass a second current. A difference between the first current and the second current may correspond to a least significant bit of the input digital signal. At least one of the first and third transistors may be configured to pass currents between the first and second currents to produce an output of the N-bit DAC. At least some of the fourth transistors may be controlled by adding a value of one to the second set of N/2 bits.

Each of the first, second, third, and fourth transistors may comprise plural transistors that are connected in parallel and that are each sized to pass different amounts of current. The plural transistor may be sized in sequence so that a transistor at one end passes most current and a transistor at another end passes least current.

This patent application also describes automatic test equipment (ATE) comprising circuitry to provide digital control signals and an analog-to-digital converter (DAC) to convert the digital signals to analog form for transmission to a device under test (DUT). The DAC comprises coarse interpolation DACs configured to produce a current range and fine interpolation DACs configured to produce an output current that is within the current range produced by the coarse interpolation DACs. The foregoing DAC may include one or more of the following features, either alone or in combination.

The ATE may comprise pin electronics to receive an analog test signal from the DUT, where the analog test signal is based on one or more of the digital signals converted to analog form by the DAC. The DAC may include any one or more of the foregoing features described above. The DAC may be used for frequency tracking.

Elements of different embodiments including the features described above may be combined to form embodiments not specifically described herein.

The details of one or more examples are set forth in the accompanying drawings and the description below. Further features, aspects, and advantages will become apparent from the description, the drawings, and the claims.

DESCRIPTION OF THE DRAWINGS

Like reference numerals in different figures indicate like elements.

DETAILED DESCRIPTION

Described herein is a digital-to-analog converter (DAC) that uses interpolation to produce analog signals from input digital signals. Generally speaking, a DAC operates by receiving an input digital signal, and by converting the input digital signal into an analog output current or voltage that corresponds to the input digital signal. The DAC described herein uses coarse interpolation to generate a range of analog current values, and fine interpolation to generate an analog current value output within that range. The resulting output signal is thus based on both the coarse and fine interpolation.

Figure 1:
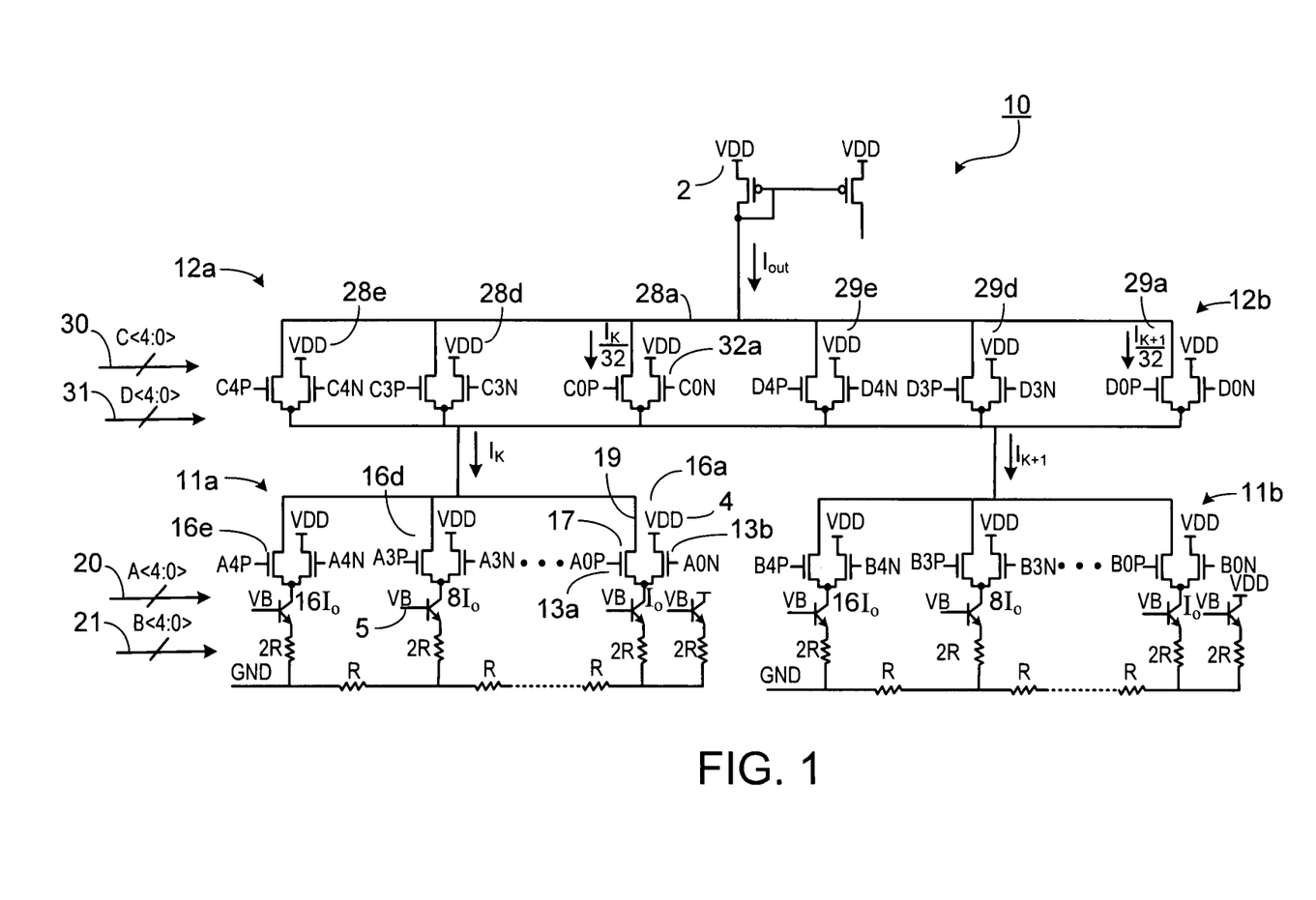
FIG. 1 is a circuit diagram of an interpolation DAC.

FIG. 1 shows an example of a DAC 10 that operates in the manner described above. DAC 10 is a 10-bit DAC, meaning that it converts a ten-bit digital signal into a corresponding analog signal. Although a ten-bit DAC is described, the concepts described herein may be generalized to any N-bit DAC, where $N \geq 2$.

DAC 10 includes coarse interpolation sub-DACs 11a and 11b, and fine interpolation sub-DACs 12a and 12b. The term "sub-DAC" is used herein to differentiate the components of DAC 10 from DAC 10 itself. In FIG. 1, there are two coarse interpolation sub-DACs 11a and 11b and two fine interpolation sub-DACs 12a and 12b. The coarse interpolation sub-DACs are controlled based on the most significant bits of an input digital signal, and the fine interpolation sub-DACs are controlled based on the least significant bits of the input digital signal. Here, the input digital signal is the digital signal that DAC 10 is converting from digital form to analog form.

Each sub-DAC is comprised of parallel-connected transistor pairs in this example. For a ten-bit DAC, each sub-DAC (for both fine and coarse interpolation) includes five such transistor pairs. The number of transistor pairs in each sub-DAC corresponds to half the number of bits being converted by the DAC. So, for an N-bit DAC, each sub-DAC includes N/2 transistor pairs. For a ten-bit DAC, there are five transistor pairs per sub-DAC, for an eight-bit DAC, there are four transistor pairs per sub-DAC, and so on.

Taking transistor pair 16a as an example, each transistor pair includes two transistors: a transistor 13a in the output current ($I_K$) path and a transistor 13b outside of the $I_K$ current path. Each transistor, such as 13a, in the $I_K$ current path includes a gate 17 to receive a bit of a control signal (A<4:0>), which here are the five most significant bits of the input digital signal (i.e., bits 5:9). Transistor 13a also includes a source 19, which is coupled to the sources of the other transistor pairs, and which receives a portion of current, $I_K$. The control signal (A<4:0>) determines an amount of current originating from $V_{DD}$ 2 that passes through coarse interpolation sub-DAC 11a. More specifically, each transistor in the $I_K$ current path is configured to pass, or not to pass, output current, and is controlled by a corresponding bit of M-bit signal 20 (A<4:0>) applied to its gate.

For sub-DAC 11a, M-bit control signal 20 is the N/2 most significant bits of an N-bit input digital signal (e.g., a signal being converted). Since DAC 10 is a ten-bit DAC in this example, M-bit control signal 20 is a five-bit signal, e.g., the five most significant bits of the ten-bit input digital signal. So, for example, if the input digital signal were <1110011001>, then the M-bit control signal, A, would be <11100>. As explained below, for sub-DAC 11b, the M-bit control signal, B, 21 is a variation on signal A.

From left to right in the coarse interpolation sub-DACs 11a, 11b, each transistor is sized to steer $2^J$ milliamperes (ma) of current, where J corresponds to a $J^{th}$ bit of an M-bit control signal ($0 \leq J \leq M$). In this example, the transistors in the sub-DACs are all N-channel field effect transistors (FETs). In an N-channel transistor, a one-bit brings a transistor into a conductive state, thereby allowing the transistor to pass current, whereas a zero-bit prevents the transistor from conducting, thereby preventing the transistor from passing current. In the example of a ten-bit DAC, transistor 16a is sized to pass $2^0$ or 1 ma (for J equal to 0), a next transistor (not shown) is sized to pass $2^1$ or 2 ma (for J equal to 1), a next transistor (not shown) is sized to pass $2^2$ or 4 ma (for J equal to 2), transistor 16d is sized to pass $2^3$ or 8 ma (for J equal to 3), and transistor 16e is sized to pass $2^4$ or 16 ma (for J equal to 4). Alternatively, the current passing through these transistors may be multiples of these values. It is noted that larger-sized transistors are generally required to pass greater amounts of current.

In the example of FIG. 1, if none of transistor pairs 16a to 16e are configured to pass current, 0 ma will pass, and if all of the transistor pairs are configured to pass current, 31 ma will pass. Thus, coarse interpolation sub-DAC 11a is configured to pass a current, $I_k$, of 0 ma in the event that bits 5 to 9 of M-bit signal A<4:0> are 00000 and to pass a current, $I_k$, of 31 ma in the event that bits 5 to 9 are 11111. Current between 0 ma and 31 ma are passed in the event that these bits are between 00000 and 11111.

A transistor in each N-channel transistor pair that is not in the $I_K$ current path (e.g., transistor 13b) is driven to conduction, or not, by a bit that is complementary to the bit that is applied to the gate of its counterpart in the $I_K$ current path. The current from these transistor passes from $V_{DD}$ 4 to ground, and does not contribute to the output current, $I_{OUT}$.

In this example, coarse interpolation sub-DAC 11b is configured identically to coarse interpolation sub-DAC 11a. However, the input to the gates of coarse interpolation sub-DAC 11b is M-bit signal 21 (B<4:0>). Here, M-bit signal 21 (B<4:0>) is the sum of M-bit signal 20 (A<4:0>) and one, e.g., B=A+1. As above, coarse interpolation sub-DAC 11b is configured to pass a current, $I_{k+1}$, of 0 ma in the event that bits 0 to 4 are 00000 and to pass a current, $I_{k+1}$, of 31 ma in the event that bits 0 to 4 are 11111. Current between 0 ma and 31 ma is passed in the event that the bits are between 00000 and 11111.

The current through coarse interpolation sub-DAC 11b, $I_{k+1}$, however, is one least significant bit (of the input digital signal) ahead of the current through coarse interpolation sub-DAC 11a by virtue of the addition of one to M-bit signal 20 (A<4:0>) to produce M-bit signal 21 (B<4:0>). A value between $I_k$ and $I_{k+1}$, therefore, corresponds to the current produced by the least significant bits of the input digital signal. That is, the value of $I_k$ corresponds to the least amount of current output (e.g., assuming all least significant bits of the input digital signal are zero). The value of $I_{k+1}$ corresponds to the output current for the next increment of digital signals (i.e., the current input digital signal augmented by one). The least significant bits of the input digital signal are used to identify a value between $I_k$ and $I_{k+1}$. This is depicted graphically in FIG. 2, where $I_k$ corresponds to location 24 on step 26 and $I_{k+1}$ corresponds to location 25.

Figure 2:
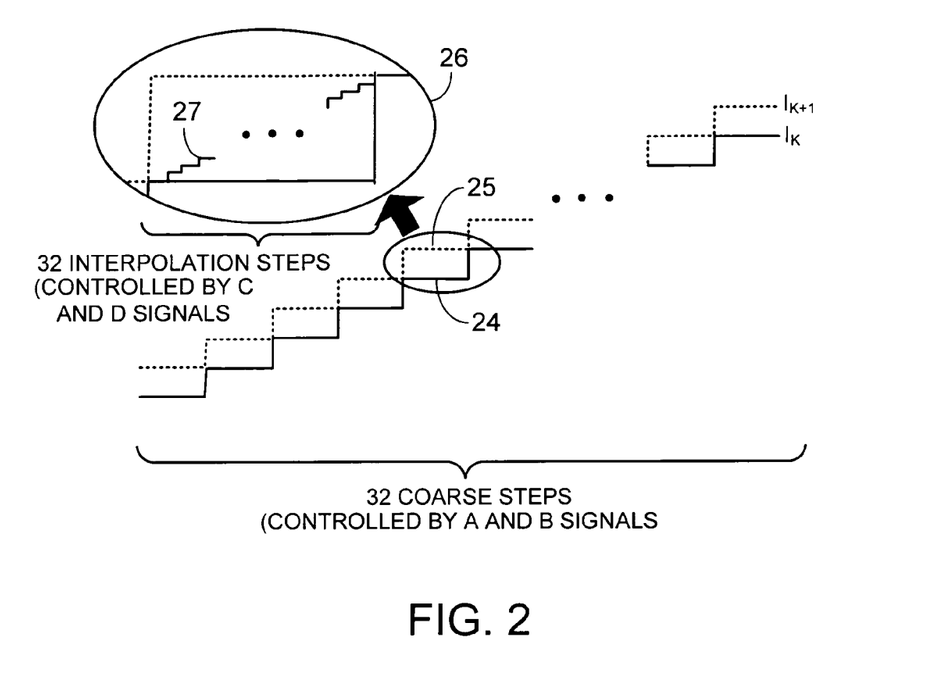
FIG. 2 is a graph showing fine and coarse interpolation steps produced by components of the interpolation DAC.

In FIG. 2, coarse interpolation sub-DAC 11a produces the $I_k$ step values 24 and coarse interpolation sub-DAC 11b produces the $I_{k+1}$ step values 25. Here, the number of coarse steps for an N-bit DAC is $2^{N/2}$. So, for a ten-bit DAC, the number of coarse steps would be $2^5$, or thirty-two (32), and so on. Values in between each $I_k$ and $I_{k+1}$, namely values 27, correspond to the current produced by the least significant bits of the input digital signal. These values 27, also referred to as "fine interpolation steps, are determined by fine interpolation sub-DACs 12a and 12b (FIG. 1). Generally speaking, for an N-bit DAC, there are $2^{N/2}$ fine interpolation steps between $I_k$ and $I_{k+1}$. Thus, in the ten-bit DAC example, there are thirty-two (32) fine interpolation steps.

Fine interpolation sub-DACs 12a and 12b steer current in order to interpolate between $I_k$ and $I_{k+1}$. Specifically, the least significant bits of the input digital signal (or variations thereof) are applied to gates of transistor pairs 28a to 28e and 29a to 29e in the fine interpolation sub-DACs 12a and 12b, respectively, in order to select a value between $I_k$ and $I_{k+1}$. This selected value effectively supplements $I_k$ to produce an output current, $I_{out}$, that corresponds to an analog version of the input digital signal.

Fine interpolation sub-DAC 12a is controlled by an M-bit signal 30 (C<4:0>). In this example, C is a five-bit signal that corresponds to the least significant bits of the input digital signal. So, if the input digital signal were <1110011001>, then C would be <11001>. As above, from left to right in the fine interpolation sub-DACs, each transistor is sized to steer different amounts of current. The amount of current corresponds to $2^J$, where J corresponds to an $J^{th}$ bit of an M-bit control signal ($0 \leq J \leq M$). In this example, M is 5, since the input digital signal is a ten-bit signal, and M is N/2. As in the case of the coarse interpolation sub-DACs, each transistor of each fine interpolation sub-DAC is configured to pass $2^J$ mA of current. These numbers will change for a different-size DAC.

Fine interpolation sub-DAC 12a is controlled by applying the least significant bits of the input digital signal to the gates of its transistors 28a to 28e, which are in the output current path (the complements of those bits are applied to the transistors that are not in the output current path, such as transistor 32a). So, for example if C<4:0> has values of <00000>, no current will pass through fine interpolation sub-DAC 12a. If C<4:0> has values of <11111>, the whole $I_K$ current will pass through fine interpolation sub-DAC 12a. If C<4:0> has values between <11111> and <00000>, an amount of current between 0 mA and $I_K$ will pass through fine interpolation sub-DAC 12a.

Fine interpolation sub-DAC 12b is controlled by applying the complement of the least significant bits of the input digital signal to the gates of its transistors 29a to 29e, which are in the output current path (the complements of those bits are applied to the transistors that are not in the output current path, as above). That is, if C<4:0> has values of <01010>, its complement, D<4:0> is <10101>. These complement bits are applied to the gates of transistors 29a to 29e in fine interpolation sub-DAC 12b to control their operation, i.e., to regulate the amount of current that passes through fine interpolation sub-DAC 12b. The resulting current, $I_{OUT}$, through fine interpolation sub-DACs 12a and 12b corresponds to an interpolation between $I_k$ and $I_{k+1}$ that is controlled by the values of the C and D signals. Thus, the output current, $I_{OUT}$, which is the output of DAC 10, has a value between $I_K$ and $I_{K+1}$.

The following mathematical description shows values of individual increments, or steps, produced by the coarse and fine interpolation sub-DACs. For the coarse interpolation sub-DACs, given A=K for $0 \leq K \leq 31$, B=K+1 and, thus, $I_{K+1} - I_K = 1$ LSB (where LSB stands for current corresponding to one Least Significant Bit (for coarse sub-DACs 11a, 11b)). For the fine interpolation sub-DACs used in a ten-bit DAC, the following shows that the difference in current between the two fine interpolation sub-DACs 12a and 12b is constant and corresponds to a multiple of one LSB.

$$I_{OUT(C)} = C(I_{K+1}/32) + (31-C)(I_K/32)$$

$$I_{OUT(C+1)} = (C+1)(I_{K+1}/32) + (31-C-1)(I_K/32)$$

$$I_{OUT(C+1)} - I_{OUT(C)} = (C+1)(I_{K+1}/32) - C(I_{K-1}/32) + (31-C-1)(I_K/32) - (31-C)I_K/32$$

$$= (I_{K+1} - I_K)/32$$

$$= 1LSB/32$$

In the above example, C is the five-bit control input to fine interpolation sub-DAC 12a, and 31-C is the complement of C (i.e., D), which is the five-bit control input to fine interpolation sub-DAC 12b. It is noted that the above equations can be generalized for an N-bit DAC ($N \geq 2$) by replacing 32 with $2^{N/2}$.

As shown in FIG. 1, a control signal, VB 5, is applied to the gates of bipolar junction transistors (BJTs) in each coarse sub-DAC to turn DAC 10 on or off. If the BJTs are driven to conduction, DAC 10 is on. If not, DAC 10 is off.

Figure 3:
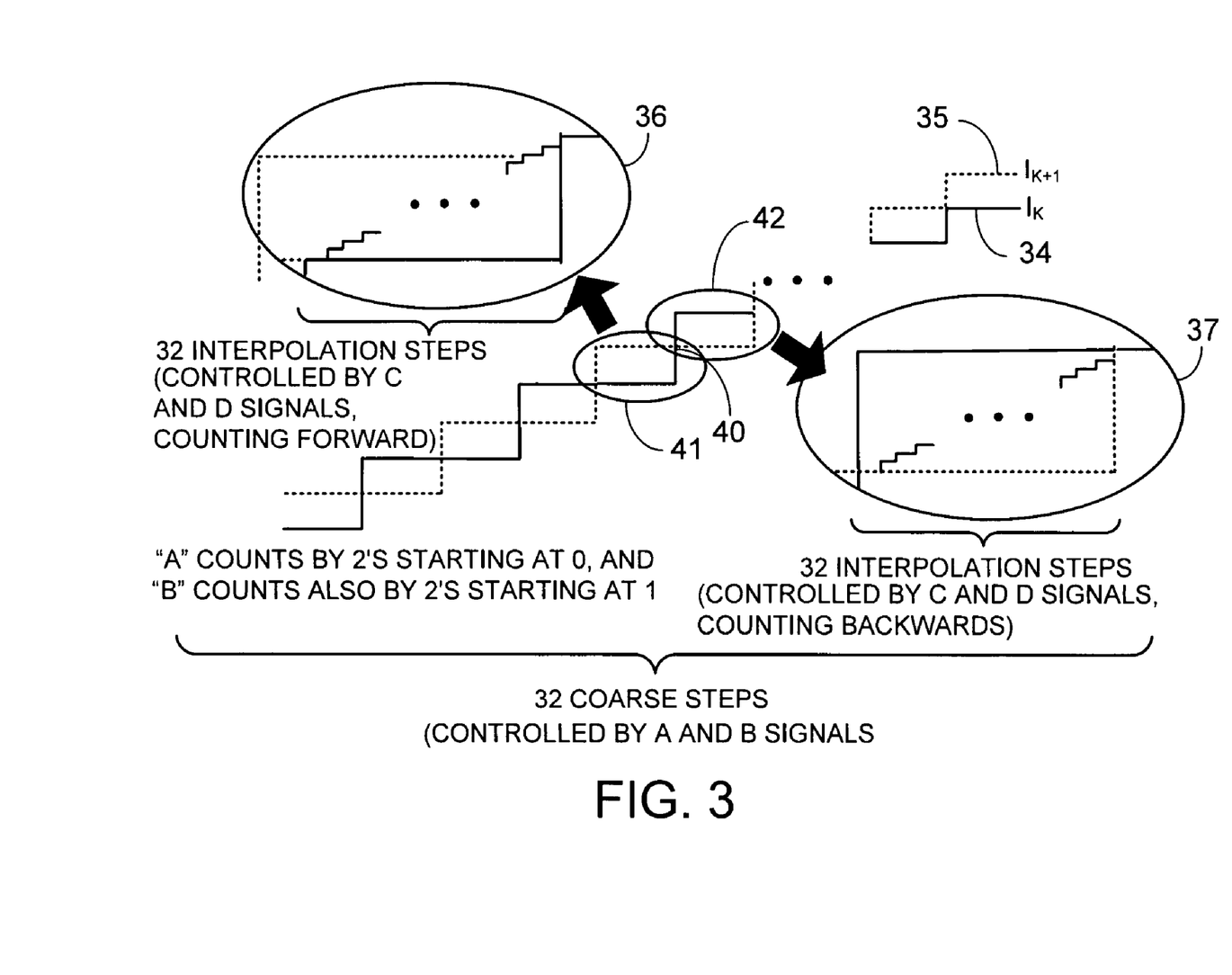
FIG. 3 is a graph showing fine and coarse interpolation steps produced by components of an alternative implementation of interpolation DAC.

In an alternative implementation, the value of the B signals may be different from A+1. For example, in one implementation, B=A+1 for even-numbered values of A, and B=A−1 for odd-numbered values of A. These values of A and B produce the coarse steps 34 and 35, respectively, for $I_K$ and $I_{K+1}$ that are shown in FIG. 3. Values of C and D control the fine interpolation sub-DACs as was the case above. However, for even-numbered values of A, i.e., for even steps such as step 36, the C and D signals control the fine interpolation sub-DACs in the same manner as above—i.e., the least significant bits are used for the C signal and the most significant bits are used for the D signal. For odd-numbered values of A, i.e., for odd steps such as step 37, the C and D signals control the fine interpolation sub-DACs counting backward, meaning that the complement of the least significant bits are used for the C signal and the least significant bits are used for the D signal. Logic (not shown) identifies whether a current step is an even step or an odd step, and then applies the appropriate values of C and D to the coarse and fine interpolation sub-DACs.

One advantage of the foregoing configuration is that a starting point 40 of an interpolation interval 42 is the same as an ending point of the previous interpolation interval 41. This reduces, and in some cases eliminates, effects caused by variations in locations of the interpolation intervals.

In one implementation, the output of DAC 10 may be processed. For example, the output $I_{OUT}$ of DAC 10 may be subtracted from a predefined maximum current value provided, e.g., by a current source, in order to produce a signal that is complementary to $I_{OUT}$. The subtraction may be performed using analog and/or digital circuitry.

DAC 10 is shown implemented using N-channel field-effect transistors (FETs); however, it may be implemented using P-channel FETs, a combination of N-channel and P-channel FETs, and/or other types of transistors. A 10-bit DAC is described; however, the DAC may be used to convert a signal comprised of any number of bits.

Figure 4:
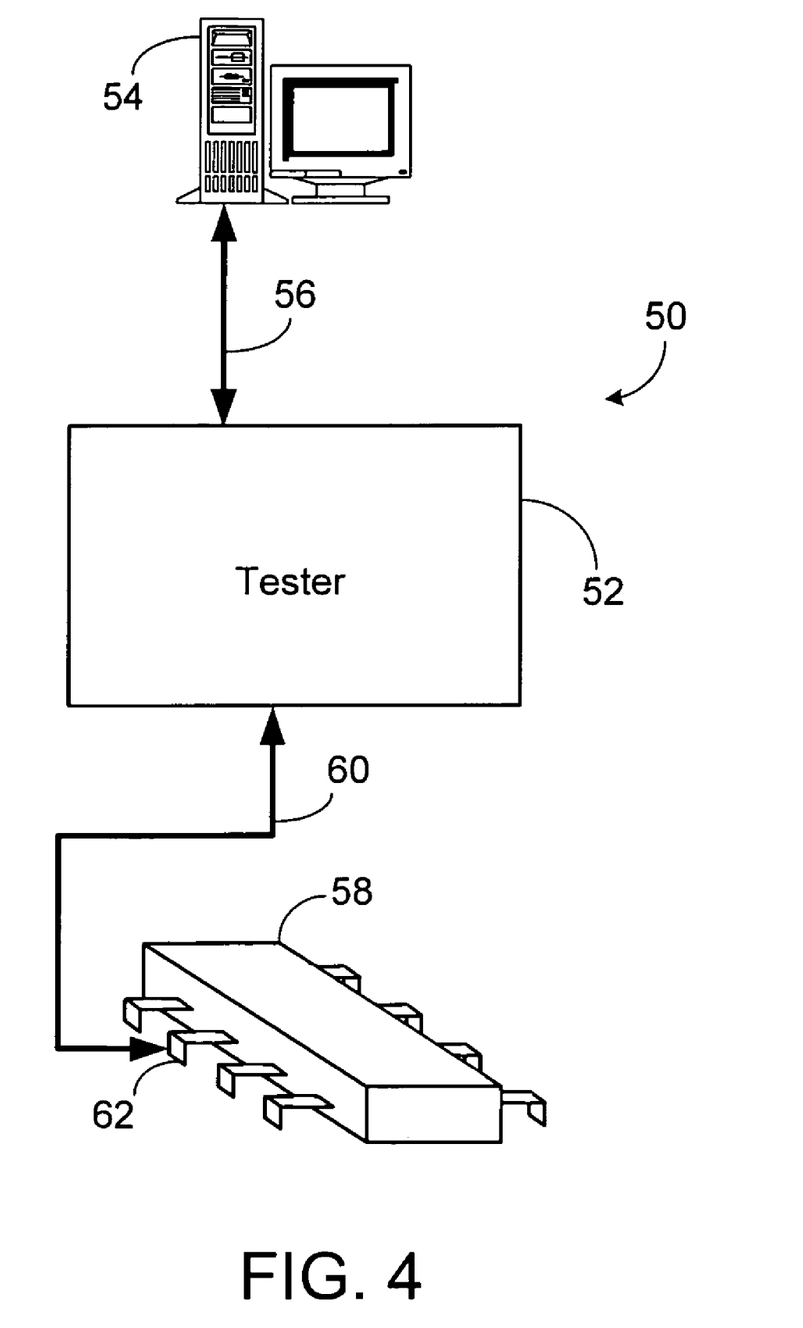
FIG. 4 is a block diagram of ATE for testing devices.

DAC 10 may be used in connection with automatic test equipment (ATE), such as the ATE shown in FIG. 4. For example, it may be used to in a process for frequency tracking, e.g., matching a frequency of one signal to that of another. That is, the DAC may be used to perform any necessary digital-to-analog conversions in such a process.

Referring to FIG. 4, an ATE system 50 for testing a device-under-test (DUT) 58, such as a semiconductor device, includes a tester 52. To control tester 52, system 50 includes a computer system 54 that interfaces with tester 52 over a hardwire connection 56. Typically, computer system 54 sends commands to tester 52 to initiate execution of routines and functions for testing DUT 58. Such executing test routines may initiate the generation and transmission of test signals to the DUT 58 and collect responses from the DUT. Various types of DUTs may be tested by system 50. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 52 is connected to one or more connector pins that provide an interface for the internal circuitry of DUT 58. To test some DUTs, e.g., as many as sixty-four or one hundred twenty-eight connector pins (or more) may be interfaced to tester 52. For illustrative purposes, in this example, semiconductor device tester 52 is connected to one connector pin of DUT 58 via a hardwire connection. A conductor 60 (e.g., cable) is connected to pin 62 and is used to deliver test signals (e.g., PMU test signals, PE test signals, etc.) to the internal circuitry of DUT 58. Conductor 60 also senses signals at pin 62 in response to the test signals provided by semiconductor device tester 52. For example, a voltage signal or a current signal may be sensed at pin 62 in response to a test signal and sent over conductor 60 to tester 52 for analysis. Such single port tests may also be performed on other pins included in DUT 18. For example, tester 52 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 60 to pin 62 for storing a digital value on DUT 58. Once stored, DUT 18 may be accessed to retrieve and send the stored digital value over conductor 60 to tester 52. The retrieved digital value may then be identified to determine if the proper value was stored on DUT 58.

Along with performing one-port measurements, a two-port test may also be performed by semiconductor device tester 52. For example, a test signal may be injected over conductor 60 into pin 62 and a response signal may be collected from one or more other pins of DUT 58. This response signal is provided to semiconductor device tester 52 to determine quantities, such as gain response, phase response, and other throughput measurement quantities.

Figure 5:
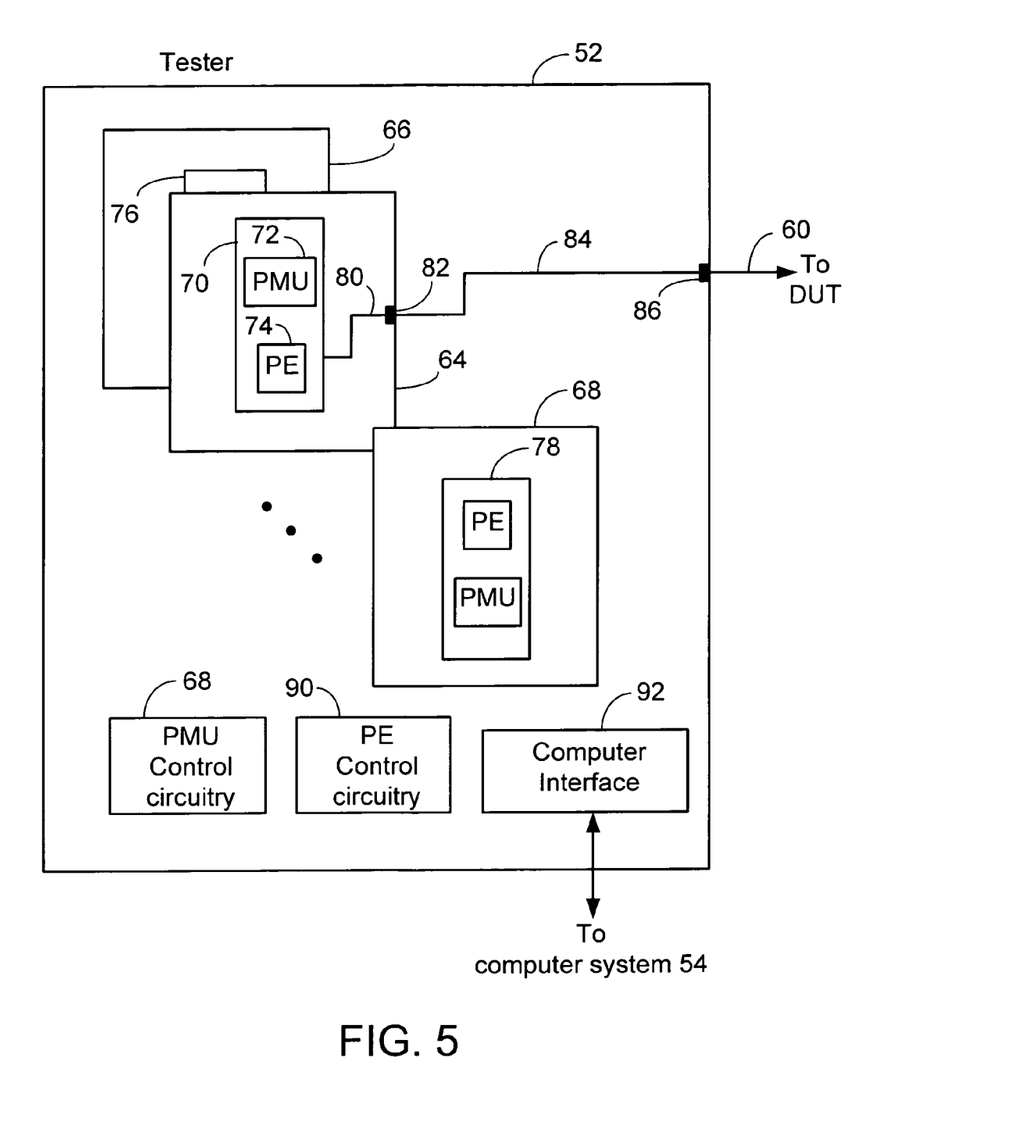
FIG. 5 is a block diagram of a tester used in the ATE.

Referring also to FIG. 5, to send and collect test signals from multiple connector pins of a DUT (or multiple DUTs), semiconductor device tester 52 includes an interface card 64 that can communicate with numerous pins. For example, interface card 64 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 52, the overall number of channels increases, thereby further reducing testing time. In this example, two additional interface cards 66 and 68 are shown to demonstrate that multiple interface cards may populate tester 52.

Each interface card includes a dedicated integrated circuit (IC) chip (e.g., an application specific integrated circuit (ASIC)) for performing particular test functions. For example, interface card 64 includes IC chip 70 for performing parametric measurement unit (PMU) tests and pin electronics (PE) tests. IC chip 70 has a PMU stage 72 that includes circuitry for performing PMU tests and a PE stage 74 that includes circuitry for performing PE tests. Additionally, interface cards 66 and 68 respectively include IC chips 76 and 78 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 58) and collecting responses to further characterize the performance of the DUT. For example, IC chip 70 may transmit (to the DUT) AC test signals that represent a vector of binary values for storage on the DUT. Once these binary values have been stored, the DUT may be accessed by tester 52 to determine if the correct binary values have been stored. Since digital signals typically include abrupt voltage transitions, the circuitry in PE stage 74 on IC chip 70 operates at a relatively high speed in comparison to the circuitry in PMU stage 72. The DAC described herein may be part of the PE stage and/or part of the PMU stage.

To pass both DC and AC test signals from interface card 64 to DUT 58, a conducting trace 80 connects IC chip 70 to an interface board connector 82 that allows signals to be passed on and off interface board 64. Interface board connector 82 is also connected to a conductor 84 that is connected to an interface connector 86, which allows signals to be passed to and from tester 52. In this example, conductor 60 is connected to interface connector 86 for bi-directional signal passage between tester 52 and pin 62 of DUT 58. In some arrangements, an interface device may be used to connect one or more conductors from tester 52 to the DUT. For example, the DUT (e.g., DUT 58) may be mounted onto a device interface board (DIB) for providing access to each DUT pin. In such an arrangement, conductor 60 may be connected to the DIB for placing test signals on the appropriate pin(s) (e.g., pin 62) of the DUT.

In this example, only conducting trace 80 and conductor 84 respectively connect IC chip 70 and interface board 64 for delivering and collecting signals. However, IC chip 70 (along with IC chips 76 and 78) typically has multiple pins (e.g., eight, sixteen, etc.) that are respectively connected with multiple conducting traces and corresponding conductors for providing and collecting signals from the DUT (via a DIB). Additionally, in some arrangements, tester 52 may connect to two or more DIB's for interfacing the channels provided by interface cards 64, 66, and 68 to one or multiple devices under test.

To initiate and control the testing performed by interface cards 64, 66, and 68, tester 52 includes PMU control circuitry 88 and PE control circuitry 90 that provide test parameters (e.g., test signal voltage level, test signal current level, digital values, etc.) for producing test signals and analyzing DUT responses. The PMU control circuitry and PE control circuitry may be implemented using one or more processing devices. Examples of processing devices include, but are not limited to, a microprocessor, a microcontroller, programmable logic (e.g., a field-programmable gate array), and/or combination(s) thereof. Tester 52 also includes a computer interface 92 that allows computer system 54 to control the operations executed by tester 52 and also allows data (e.g., test parameters, DUT responses, etc.) to pass between tester 52 and computer system 54.

The ATE described herein is not limited to use with the hardware and software described above. The ATE described herein can be implemented using any hardware and/or software. For example, the ATE described herein, or portion(s) thereof, can be implemented, at least in part, using digital electronic circuitry, or in computer hardware, firmware, software, or in combinations thereof.

The ATE described herein (e.g., the functions performed by the processing device) can be implemented, at least in part, via a computer program product, i.e., a computer program tangibly embodied in an information carrier, e.g., in a one or more machine-readable media or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing the ATE can be performed by one or more programmable processors executing one or more computer programs to perform the functions of the ATE described herein. All or part of the ATE can be implemented as special purpose logic circuitry, e.g., an FPGA (field programmable gate array) and/or an ASIC (application-specific integrated circuit).

Processors suitable for the execution of a computer program include, by way of example, both general and special purpose microprocessors, microcontrollers, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. Other embodiments not specifically described herein are also within the scope of the following claims.

What is claimed is:

1. A digital-to-analog converter (DAC) comprising:
coarse interpolation DACs configured to produce a current range based on a digital signal; and
fine interpolation DACs configured to produce an output current that is based on the digital signal and that is within the current range produced by the coarse interpolation DACs;
wherein the coarse interpolation DACs comprise two DACs that are controlled based on a first subset of bits from the digital signal; and
wherein the fine interpolation DACs comprise two DACs that are controlled based on a second subset of bits from the digital signal.

2. The DAC of claim 1, wherein the first subset of bits comprise more significant bits in the digital signal than the second subset of bits.

3. The DAC of claim 1, wherein the coarse interpolation DACs comprise a first coarse interpolation DAC that is controlled directly by the first subset of bits, and a second coarse interpolation DAC that is controlled by sums or differences that are formed from the first subset of bits.

4. The DAC of claim 3, wherein the fine interpolation DACs comprise a first fine interpolation DC that is controlled directly by the second subset of bits, and a second fine interpolation DAC that is controlled by a complement of the second subset of bits.

5. The DAC of claim 1, wherein the output current produced by the fine interpolation DACs corresponds to an analog current for the digital signal.

6. A digital-to-analog converter (DAC) comprising:
coarse interpolation DACs configured to produce a current range based on an input digital signal;
fine interpolation DACs configured to produce an output current that is based an input digital signal and that is within the current range produced by the coarse interpolation DACs;
wherein the output current produced by the fine interpolation DACs corresponds to an analog current for the input digital signal;
a current source to supply current, the current source being capable of outputting a maximum current; and
circuitry to subtract the analog current from the maximum current to produce a DAC output.

7. A digital-to-analog converter (DAC) comprising:
coarse interpolation DACs configured to produce a current range based on an input digital signal; and
fine interpolation DACs configured to produce an output current that is based on an input digital signal and that is within the current range produced by the coarse interpolation DACs;
wherein the coarse interpolation DACs each comprises parallel-connected transistors for passing current from the fine interpolation DACs; and
wherein the fine interpolation DACs each comprises parallel-connected transistors for passing current from a current source to a corresponding coarse interpolation DAC.

8. A digital-to-analog converter (DAC) comprising:
coarse interpolation DACs configured to produce a current range based on an input digital signal;
fine interpolation DACs configured to produce an output current that is based on an input digital signal and that is within the current range produced by the coarse interpolation DACs;
wherein the DAC comprises an N-bit DAC, where $N \geq 2$; and
wherein each of the coarse interpolation DACs and the fine interpolation DACs comprises N transistors.

9. A digital-to-analog converter (DAC) comprising:
coarse interpolation DACs configured to produce a current range based on an input digital signal;
fine interpolation DACs configured to produce an output current that is based on an input digital signal and that is within the current range produced by the coarse interpolation DACs; and
circuitry to generate a complement of the output current, the complement of the output current being an output of the DAC.

10. An N-bit ($N \geq 2$) digital-to-analog converter (DAC) comprising:

first transistors that are controllable to pass current from a current source, the first transistors comprising N/2 pairs of transistors that are controlled based on a first set of N/2 bits of an input digital signal or a complement of the first set of N/2 bits;

second transistors that are controllable to pass current from the first transistors, the second transistors comprising N/2 pairs of transistors that are controlled based on a second set of N/2 bits of the input digital signal;

third transistors that are controllable to pass current from the current source, the third transistors comprising N/2 pairs of transistors that are controlled based on the complement of the first set of N/2 bits or by the first set of N/2 bits; and fourth transistors that are controllable to pass current from the third transistors, the fourth transistors comprising N/2 pairs of transistors that are controlled based on the second set of N/2 bits with a value added thereto or subtracted therefrom.

11. The N-bit DAC of claim 10, wherein at least one of the second transistors is configured to pass a first current and at least one of the fourth transistors is configured to pass a second current; and wherein at least one of the first and third transistors are configured to pass currents between the first and second currents to produce an output of the N-bit DAC.

12. The N-bit DAC of claim 10, wherein at least some of the fourth transistors are controlled by adding a value of one to the second set of N/2 bits.

13. The N-bit DAC of claim 10, wherein each of the first, second, third, and fourth transistors comprises plural transistors that are connected in parallel and that are each sized to pass different amounts of current.

14. The N-bit DAC of claim 13, wherein the plural transistor are sized in sequence so that a transistor at one end of the sequence passes most current and a transistor at another end of the sequence passes least current.

15. Automatic test equipment (ATE) comprising:
circuitry to provide digital control signals; and
a digital-to-analog converter (DAC) to convert the digital signals to analog form for transmission to a device under test (DUT);
wherein the DAC comprises:
coarse interpolation DACs configured to produce a current range; and
fine interpolation DACs configured to produce an output current that is within the current range produced by the coarse interpolation DACs;
wherein the DAC comprises an N-bit DAC; and
wherein the N-bit DAC comprises:
first transistors that are controllable to pass current from a current source, the first transistors comprising N/2 pairs of transistors that are controlled based on a first set of N/2 bits of an input digital signal or a complement of the first set of N/2 bits;
second transistors that are controllable to pass current from the first transistors, the second transistors comprising N/2 pairs of transistors that are controlled based on a second set of N/2 bits of the input digital signal;
third transistors that are controllable to pass current from the current source, the third transistors comprising N/2 pairs of transistors that are controlled based on the complement of the first set of N/2 bits or by the first set of N/2 bits; and
fourth transistors that are controllable to pass current from the third transistors, the fourth transistors comprising N/2 pairs of transistors that are controlled based on the second set of N/2 bits with a value added or subtracted thereto.

16. The ATE of claim 15, further comprising:
pin electronics to receive an analog test signal from the DUT, the analog test signal being in response to one or more of the digital signals converted to analog form by the DAC.

17. Automatic test equipment (ATE) comprising:
circuitry to provide digital control signals; and
a digital-to-analog converter (DAC) to convert the digital signals to analog form for transmission to a device under test (DUT);
wherein the DAC comprises:
coarse interpolation DACs configured to produce a current range; and
fine interpolation DACs configured to produce an output current that is within the current range produced by the coarse interpolation DACs;
wherein the coarse interpolation DACs comprise a first coarse interpolation DAC that is controlled directly by a first subset of bits, and a second coarse interpolation DAC that is controlled by sums or differences that are formed from the first subset of bits.

18. The ATE of claim 17, wherein the fine interpolation DACs comprise a first fine interpolation DC that is controlled directly by a second subset of bits, and a second fine interpolation DAC that is controlled by a complement of the second subset of bits.

19. Automatic test equipment (ATE) comprising:
circuitry to provide digital control signals; and
a digital-to-analog converter (DAC) to convert the digital signals to analog form for transmission to a device under test (DUT);
wherein the DAC comprises:
coarse interpolation DACs configured to produce a current range; and
fine interpolation DACs configured to produce an output current that is within the current range produced by the coarse interpolation DACs; and
wherein the DAC is used for frequency tracking.

20. The DAC of claim 6, wherein the coarse interpolation DACs comprise a first coarse interpolation DAC that is controlled directly by a first subset of bits, and a second coarse interpolation DAC that is controlled by sums or differences that are formed from the first subset of bits.

21. The DAC of claim 20, wherein the fine interpolation DACs comprise a first fine interpolation DC that is controlled directly by a second subset of bits, and a second fine interpolation DAC that is controlled by a complement of the second subset of bits.

22. The DAC of claim 8, wherein the coarse interpolation DACs comprise a first coarse interpolation DAC that is controlled directly by a first subset of bits, and a second coarse interpolation DAC that is controlled by sums or differences that are formed from the first subset of bits.

23. The DAC of claim 22, wherein the fine interpolation DACs comprise a first fine interpolation DC that is controlled directly by a second subset of bits, and a second fine interpolation DAC that is controlled by a complement of the second subset of bits.

24. The DAC of claim 9, wherein the coarse interpolation DACs comprise a first coarse interpolation DAC that is controlled directly by a first subset of bits, and a second coarse interpolation DAC that is controlled by sums or differences that are formed from the first subset of bits.

25. The DAC of claim 24, wherein the fine interpolation DACs comprise a first fine interpolation DC that is controlled directly by a second subset of bits, and a second fine interpolation DAC that is controlled by a complement of the second subset of bits.

26. The ATE of claim 19, wherein the coarse interpolation DACs comprise a first coarse interpolation DAC that is controlled directly by a first subset of bits, and a second coarse interpolation DAC that is controlled by sums or differences that are formed from the first subset of bits.

27. The ATE of claim 26, wherein the fine interpolation DACs comprise a first fine interpolation DC that is controlled directly by a second subset of bits, and a second fine interpolation DAC that is controlled by a complement of the second subset of bits.

\* \* \* \* \*

UNITED STATES PATENT AND TRADEMARK OFFICE
CERTIFICATE OF CORRECTION

| | | |
|---|---|---|
| PATENT NO. | : 7,595,746 B2 | Page 1 of 1 |
| APPLICATION NO. | : 11/964254 | |
| DATED | : September 29, 2009 | |
| INVENTOR(S) | : Cosmin Iorga and Alan Hussey | |

It is certified that error appears in the above-identified patent and that said Letters Patent is hereby corrected as shown below:

Column 10, Line 10, Claim 4:
delete "DC" and insert -- DAC --, therefor.

Column 10, Line 21, Claim 6:
after "based", insert -- on --.

Column 11, Line 63, Claim 15:
delete "arc" and insert -- are --, therefor.

Column 12, Line 26, Claim 18:
delete "DC" and insert -- DAC --, therefor.

Column 12, Line 49, Claim 21:
delete "DC" and insert -- DAC --, therefor.

Column 12, Line 59, Claim 23:
delete "DC" and insert -- DAC --, therefor.

Column 13, Line 2, Claim 25:
delete "DC" and insert -- DAC --, therefor.

Column 14, Line 4, Claim 27:
delete "DC" and insert -- DAC --, therefor.

Signed and Sealed this
Twenty-eighth Day of February, 2012

David J. Kappos
*Director of the United States Patent and Trademark Office*